(12) United States Patent
Wakana et al.

(10) Patent No.: US 8,912,537 B2
(45) Date of Patent: Dec. 16, 2014

(54) SEMICONDUCTOR DEVICE, RFID TAG USING THE SAME AND DISPLAY DEVICE

(75) Inventors: Hironori Wakana, Hitachi (JP); Tetsufumi Kawamura, Kodaira (JP); Hiroyuki Uchiyama, Musashimurayama (JP); Kuniharu Fujii, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 25 days.

(21) Appl. No.: 13/642,612

(22) PCT Filed: Apr. 22, 2011

(86) PCT No.: PCT/JP2011/059906
§ 371 (c)(1),
(2), (4) Date: Nov. 21, 2012

(87) PCT Pub. No.: WO2011/132769
PCT Pub. Date: Oct. 27, 2011

(65) Prior Publication Data
US 2013/0099229 A1    Apr. 25, 2013

(30) Foreign Application Priority Data

Apr. 23, 2010 (JP) .................................. 2010-099560

(51) Int. Cl.
*H01L 29/78* (2006.01)
*H01L 29/786* (2006.01)

(52) U.S. Cl.
CPC .................................. *H01L 29/7869* (2013.01)
USPC .................................. 257/43; 257/59; 257/72

(58) Field of Classification Search
CPC .............. H01L 29/786; H01L 29/7869; H01L 21/02554; H01L 27/1225
USPC .................................................. 257/43, 59, 72
See application file for complete search history.

(56) References Cited

U.S. PATENT DOCUMENTS 7,776,656 B2 *   8/2010   Watanabe et al. ............. 438/118
2008/0073653 A1  3/2008   Iwasaki
(Continued)

FOREIGN PATENT DOCUMENTS

JP    2008-85048 A     4/2008
JP    2009-158663 A    7/2009
(Continued)

OTHER PUBLICATIONS

International Search Report with English translation dated Jul. 19, 2011 (five (5) sheets).
(Continued)

Primary Examiner — Tran Tran
(74) Attorney, Agent, or Firm — Crowell & Moring LLP

(57) ABSTRACT

Disclosed is an oxide semiconductor layer (13) which forms a channel for a thin-film transistor and which includes at least In and oxygen and one or more types of elements from among Zn, Cd, Al, Ga, Si, Sn, Ce, and Ge. A high concentration region (13d) is disposed on one section of the oxide semiconductor layer (13), whereby said region has a maximum In concentration 30 at %; or higher than other regions on the oxide semiconductor layer (13). The film thickness of the oxide semiconductor layer (13) is 100 nm max., and the film thickness of the high concentration region (13d) is 20 nm max. or, preferably, 6 nm max. This enables a thin-film transistor with a sub-threshold slope of 100 mV/decade max., a high on-current, and a high field effect mobility to be achieved.

12 Claims, 15 Drawing Sheets

(56) References Cited

U.S. PATENT DOCUMENTS

| | | |
|---|---|---|
| 2009/0166616 A1 | 7/2009 | Uchiyama |
| 2009/0180045 A1 | 7/2009 | Yoon et al. |
| 2009/0250693 A1* | 10/2009 | Jeong et al. .................. 257/43 |
| 2011/0141076 A1 | 6/2011 | Fukuhara et al. |

FOREIGN PATENT DOCUMENTS

| | | |
|---|---|---|
| JP | 2009-170905 A | 7/2009 |
| JP | 2010-18479 A | 1/2010 |
| JP | 2010-50165 A | 3/2010 |

OTHER PUBLICATIONS

Form PCT/ISA/237 (four (4) sheets).

Kim et al., "High Performance Oxide Thin Film Transistors with Double Active Layers", 2008, pp. 73-76, IEEE (four (4) sheets).

Kawamura et al., "1.5-V Operating fully-depleted amorphous oxide thin film transistors achieved by 63-mV/dec subthreshold slope", IEEE, 2008, pp. 77-80 (four (4) sheets).

* cited by examiner

SEMICONDUCTOR DEVICE, RFID TAG USING THE SAME AND DISPLAY DEVICE

TECHNICAL FIELD

The present invention relates to a semiconductor device, an RFID tag using the same, and an electronic device such as a display device and more particularly to a technique useful for a semiconductor device having a thin-film transistor (TFT) which uses oxide semiconductor for a channel layer.

BACKGROUND ART

A thin-film transistor (TFT) is used as a transistor for driving the display device of a mobile device such as a mobile phone, notebook-sized personal computer, tablet computer or PDA because its element area is small and it is space-saving.

In the past, most of thin-film transistors have been made of a silicon-based semiconductor material, typically amorphous silicon or polycrystalline silicon. However, a thin-film transistor which uses a silicon-based semiconductor material has a problem that its sub-threshold slope is as large as about 200 mV/decade and if this thin-film transistor is used to form a circuit, operation at a low voltage of about 1 to 3 V, at which an ordinary large-scale integrated circuit operates, is difficult. In addition, since its off-current is large, it has a problem that it is difficult to decrease the standby power consumption.

A solution to these problems is to produce a fully depleted state while the thin-film transistor is off, but in the case of a thin-film transistor which uses a silicon-based semiconductor material, for a reason related to the manufacturing process, it is not easy to produce a fully depleted state.

For these reasons, in recent years, research and development of thin-film transistors which use wide bandgap oxide semiconductor for a channel layer has been conducted actively.

For example, it is reported on pages 77 to 80 of Nonpatent Literature 1 (IEDM Tech. Dig., (2008)) that in a thin-film transistor using In—Ga—Zn—O (IGZO) for a channel layer, if the channel layer thickness is as thin as about 10 nm, the sub-threshold slope is not more than 100 mV/decade.

Also, it is reported on pages 73 to 76 of the above Nonpatent Literature 1 and Patent Document 1 (Japanese Unexamined Patent Application Publication No. 2009-170905) that when two or more oxide semiconductor layers are stacked, the on-current and field effect mobility are twice or more higher than in a thin-film transistor with a single-layer channel structure.

Furthermore, since a thin-film transistor which uses oxide semiconductor for a channel layer can be manufactured at low temperature, it offers an advantage that a device can be easily formed on a glass substrate or flexible substrate and a non-conventional new device can be manufactured at low cost. In addition, by taking advantage of the transparency as a feature of oxide semiconductor, it can be used not only for a display device but also for various electronic devices such as an RFID tag.

CITATION LIST

Patent Literature

Patent Literature 1: Japanese Unexamined Patent Application Publication No. 2009-170905

Nonpatent Literature

Nonpatent Literature 1: IEDM Tech. Dig., (2008)

SUMMARY OF INVENTION

Technical Problem

When a thin-film transistor using oxide semiconductor for a channel layer is used to form a circuit, from the standpoint of operation with low power consumption, the sub-threshold slope should be small and from the standpoint of high speed operation, a high on-current and a high field effect mobility are required. Also, for stable operation of the circuit, the threshold potential must be controlled.

As mentioned above, Nonpatent Literature 1 reports that by decreasing the film thickness of the channel layer of oxide semiconductor, a sub-threshold slope of 100 mV/decade can be achieved. However, in this case, there is a problem that when the channel layer is thin, a drop in on-current or field effect mobility may occur.

Also, Nonpatent Literature 1 and Patent Literature 1 report that by using a laminate of two or more oxide semiconductor layers, a high on-current and a high field effect mobility can be achieved. However, from the study conducted by the present inventors, it has been found that even in a thin-film transistor which has such a structure, it is difficult to achieve a sub-threshold slope of 100 mV/decade.

As discussed above, a thin-film transistor which uses oxide semiconductor for a channel layer has a problem that it is difficult to both decrease the sub-threshold slope and increase the on-current and field-effect mobility at the same time.

An object of the present invention is to provide a technique which achieves both a sub-threshold slope of 100 mV/decade and an on-current and field effect mobility twice or more higher than with a single-layer channel structure.

The above and further objects and novel features of the invention will more fully appear from the following detailed description in this specification and the accompanying drawings.

Solution to Problem

The following is a brief description of the gist of the representative elements of the invention laid open in this application.

An invention according to the present application is a semiconductor device having a thin-film transistor including a gate insulating film, a gate electrode, a channel layer, a source electrode, and a drain electrode which are formed over a main surface of a substrate, in which the channel layer of the thin-film transistor is made of oxide semiconductor containing at least In and oxygen and further containing one or more types of elements among Zn, Cd, Al, Ga, Si, Sn, Ce, and Ge and a portion of the channel layer has a high concentration region with a maximum In concentration 30 at or more higher than other regions of the channel layer.

Advantageous Effects of Invention

The following is a brief description of the advantageous effects achieved by the representative elements of the invention laid open in this application.

A semiconductor device having a thin-film transistor which provides a sub-threshold slope of 100 mV/decade, a high on-current and a high field effect mobility can be realized.

DESCRIPTION OF EMBODIMENTS

Figure 1:
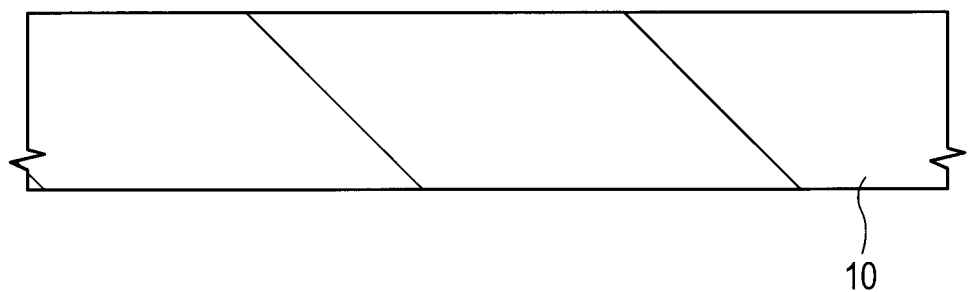
FIG. 1 is a sectional view showing a step of manufacturing a thin-film transistor according to a first embodiment of the present invention.

Next, embodiments of the present invention will be described in detail referring to drawings. In all the drawings that illustrate the embodiments, members with like functions are designated by like reference numerals and repeated descriptions thereof are omitted. Regarding the embodiments, basically the same or similar explanations are not repeated except when necessary. Regarding the drawings that illustrate the embodiments, for easy understanding of a structure, hatching may be used even in a plan view and hatching may be omitted even in a sectional view.

First Embodiment

The first embodiment is applied to a bottom gate/top contact thin-film transistor. Here, "bottom gate" means a structure in which a gate electrode is located in a layer under a channel layer and "top contact" means a structure in which a source electrode and a drain electrode are located in a layer above a channel layer. Next, the method of manufacturing a bottom gate/top contact thin-film transistor will be described in the order of process steps.

First, as shown in FIG. 1, an insulating substrate 10 is provided. The material of the substrate 10 is, for example, silicon (Si), sapphire, quartz, glass, or flexible resin sheet (what is called plastic film). The resin sheet material is, for example, polyethylene terephthalate, polyethylene naphthalate, polyetherimide, polyacrylate, polyimide, polycarbonate, cellulose triacetate, or cellulose triacetate propionate. In addition, a substrate with an insulating coating on the surface of the above substrate material may be used as needed.

Figure 2:
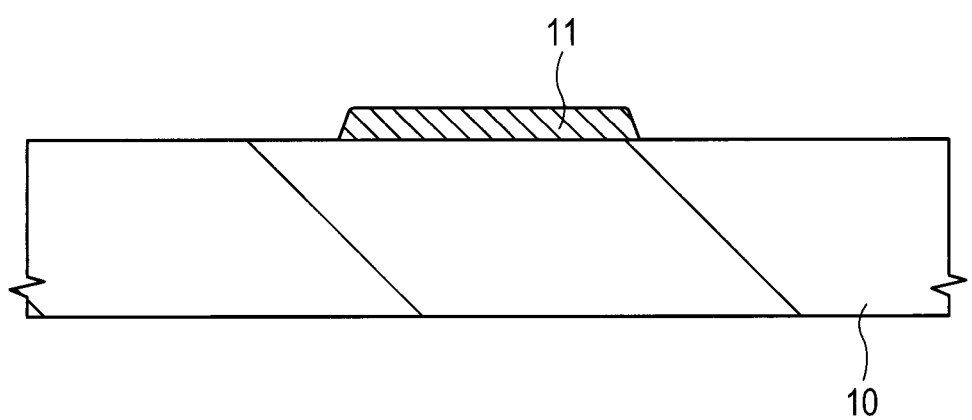
FIG. 2 is a sectional view showing a step of manufacturing a thin-film transistor which is subsequent to the step shown in FIG. 1.

Next, as shown in FIG. 2, after a conductive film is formed over the substrate 10, a gate electrode 11 is formed by patterning the conductive film. The conductive film of the gate electrode 11 is, for example, a single-layer film of metal such as molybdenum (Mo), chrome (Cr), tungsten (W), aluminum (Al), Copper (Cu), titanium (Ti), nickel (Ni), tantalum (Ta), silver (Ag), cobalt (Co), zinc (Zn), gold (Au), or platinum (Pt), or an alloy film of these metals, or a laminated film of these metals. Also, it is possible to use a conductive film of metal oxide such as ITO (In—Sn—O: indium tin oxide) or zinc oxide (ZnO) with Al, gallium (Ga), indium (In) or boron (B) added or a laminated film of these and the above metal. Furthermore, it is possible to use a conductive film of metal nitride such as titanium nitride (TiN), a laminated film of these and the above metal or a semiconductor film doped with carriers at a high concentration.

The above conductive film is formed by a CVD process, sputtering process or evaporation process. Patterning of the conductive film is done by dry etching or wet etching using photoresist film as a mask.

Figure 3:
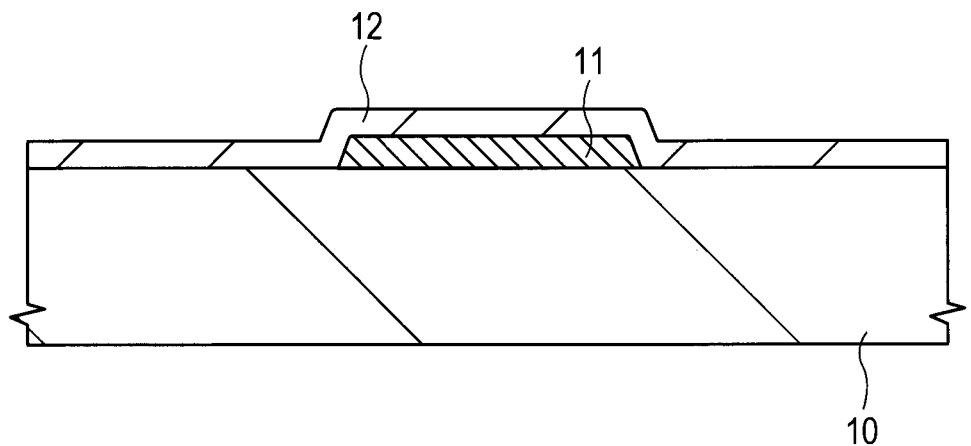
FIG. 3 is a sectional view showing a step of manufacturing a thin-film transistor which is subsequent to the step shown in FIG. 2.

Next, as shown in FIG. 3, a gate insulating film 12 is formed over the substrate 10 with the gate electrode 11 formed thereon.

The insulating film of the gate insulating film 12 is, for example, a silicon oxide film, silicon nitride film, aluminum oxide film, aluminum nitride film, $Y_2O_3$ (yttrium oxide) film, $HfO_2$ (hafnium oxide) film, yttria-stabilized zirconia (YSZ) film, or organic polymer insulating film. The material of the organic polymer insulating film is, for example, a polyimide derivative, benzocyclobutene derivative, photoacrylic derivative, polystyrene derivative, polyvinyl phenol derivative, polyester derivative, polycarbonate derivative, polyvinyl acetate derivative, polyurethane derivative, polysulfone derivative, acrylate resin, acryl resin, epoxy resin, or parylene.

The above insulating film is formed by a CVD process, sputtering process, evaporation process or coating process. Patterning of the insulating film is done by dry etching or wet etching using photoresist film as a mask. In this embodiment, as the gate insulating film 12, a silicon oxide film with a film thickness of 100 nm is deposited using a CVD process.

Figure 4:
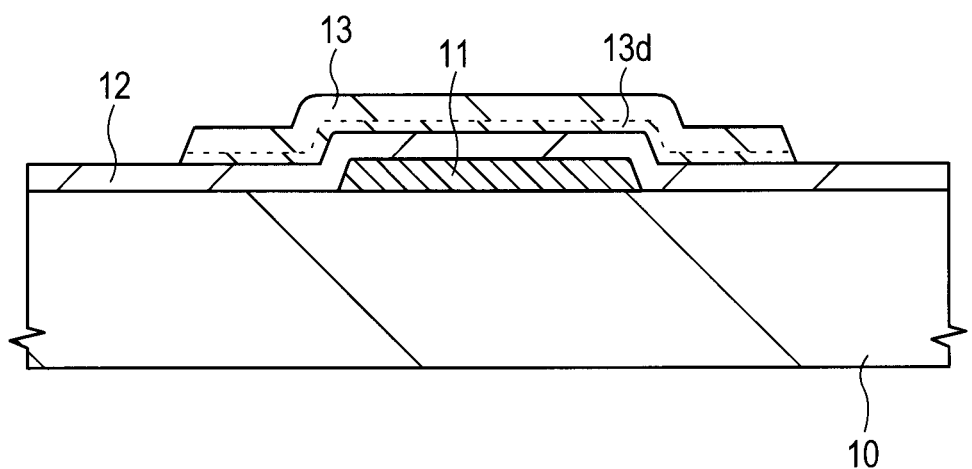
FIG. 4 is a sectional view showing a step of manufacturing a thin-film transistor which is subsequent to the step shown in FIG. 3.

Next, as shown in FIG. 4, after an oxide semiconductor layer 13 is formed over the gate insulating film 12, the oxide semiconductor layer 13 is patterned by wet etching using photoresist film as a mask so that the oxide semiconductor layer 13 remains intact just above the gate electrode 11 and in the vicinity of it.

The oxide semiconductor layer 13 is the semiconductor layer which forms the channel layer of the thin-film transistor and is a compound which includes at least In and oxygen (O) and further includes one or more types of elements among Zn, cadmium (Cd), Al, Ga, Si, Sn, cerium (Ce), and germanium (Ge). The oxide semiconductor layer 13 is formed by a sputtering process, CVD process, pulsed laser deposition (PLD) process, coating process, printing process, or co-evaporation process. After the formation of the oxide semiconductor layer 13, annealing may be done on the substrate 10 in order to enhance the performance of the thin-film transistor.

When the oxide semiconductor layer 13 is formed, deposition is made not so as to make the concentration of the In element contained in the oxide semiconductor layer 13 uniform along the film thickness direction but so as to produce a high In concentration region (high concentration region 13d shown in FIG. 4) inside the oxide semiconductor layer 13 by controlling the In concentration profile. Here, inside the oxide semiconductor layer 13, the In concentration difference between the high In concentration region (high concentration region 13d) and the other regions is up to 30 at % or more as calculated in terms of constituent elements except oxygen. In other words, deposition is made so that inside the oxide semiconductor layer 13, the high In concentration region (high concentration region 13d) has a maximum In concentration 30 at % or higher than the other regions as calculated in terms of constituent elements except oxygen.

The overall film thickness of the oxide semiconductor layer 13 should be 100 nm or less. The film thickness of the high concentration region 13d should be 20 nm max. or preferably 6 nm max. In this embodiment, a multi-target sputtering apparatus capable of depositing In—Sn—Ga—Zn—Al—O simultaneously is used to deposit an oxide semiconductor layer 13 with a film thickness of 25 nm over the gate insulating film 12. Also, at this time, a high concentration region 13d with a film thickness of 6 nm is formed in a region nearest to the gate electrode 11, or in a region adjoining the gate insulating film 12. Control of the In concentration profile inside the oxide semiconductor layer 13 is done by controlling the sputtering conditions, though the concentration can also be controlled as desired through a co-evaporation process.

Figure 5:
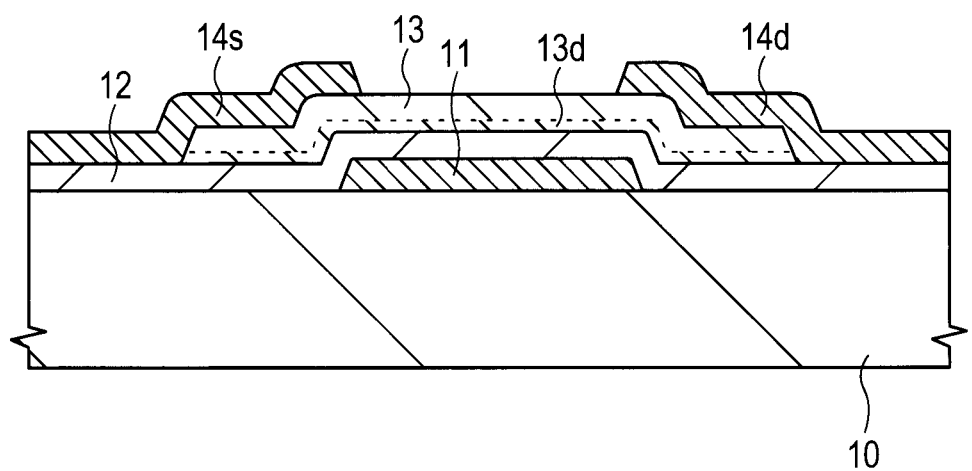
FIG. 5 is a sectional view showing a step of manufacturing a thin-film transistor which is subsequent to the step shown in FIG. 4.

As shown in FIG. 5, after a conductive film is formed over the oxide semiconductor layer 13, a source electrode 14s and a drain electrode 14d are formed by pattering the conductive film. Examples of the conductive film of the source electrode 14s and drain electrode 14d are the same various types of conductive film as for the gate electrode 11. The conductive film is formed by a CVD process, sputtering process, or evaporation process and patterning of the conductive film is done by dry etching or wet etching using photoresist film as a mask.

After that, annealing is done at 125° C. in a dry air atmosphere for three hours to complete the thin-film transistor according to the first embodiment. The channel length of the thin-film transistor is 0.1 mm and the channel width is 2 mm.

Figure 6:
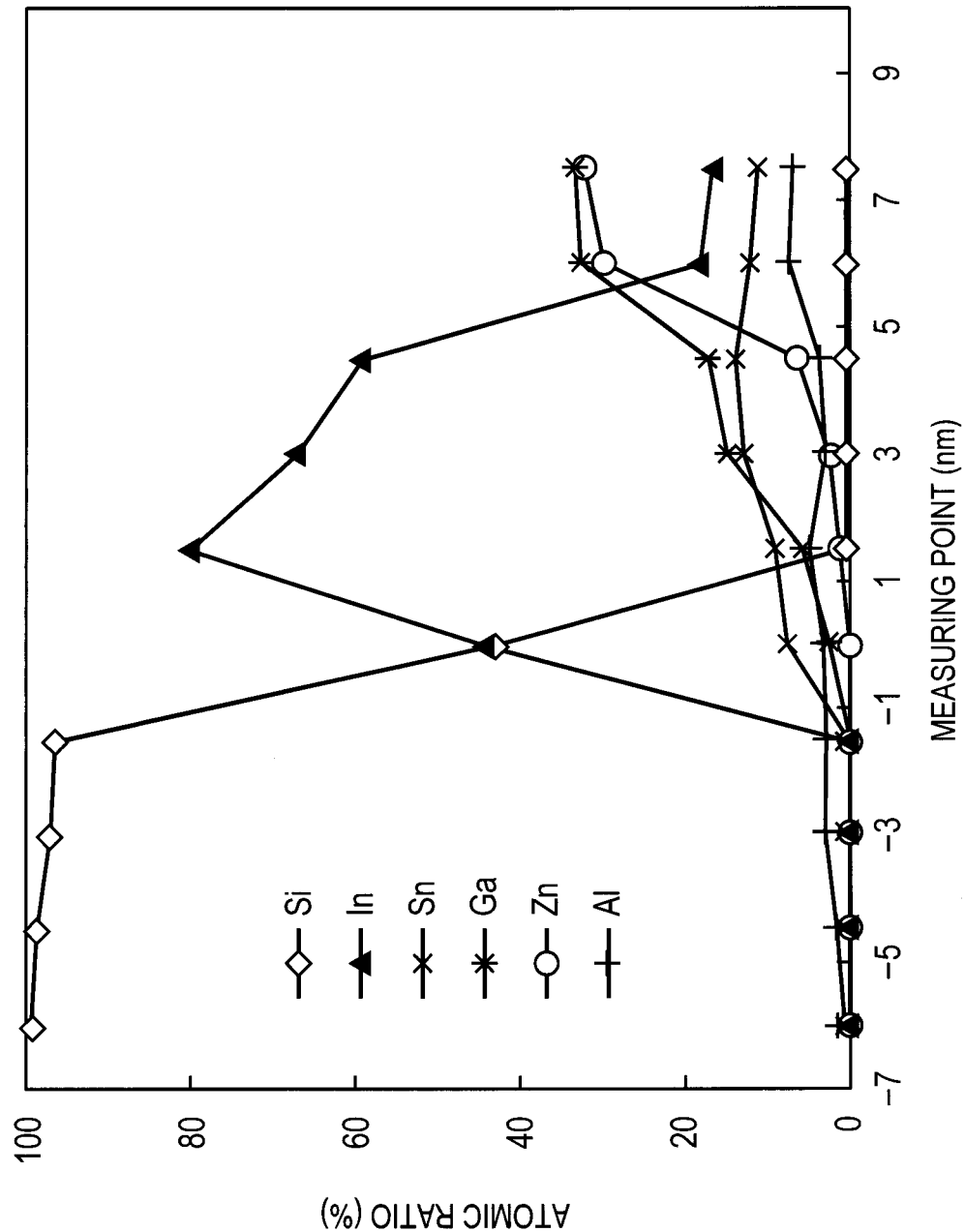
FIG. 6 is a graph which shows the result of analysis by the energy dispersive X-ray spectroscopy (EDX) method of composition distribution of constituent elements in the vicinity of the interface between the gate insulating film and oxide semiconductor layer of the thin-film transistor according to the first embodiment of the present invention.

FIG. 6 shows the result of analysis by the energy dispersive X-ray spectroscopy (EDX) method of composition distribution of constituent elements in the vicinity of the interface between the gate insulating film 12 and oxide semiconductor layer 13 of the thin-film transistor produced by the above method.

The elements which were analyzed are the constituent elements (In, Sn, Ga, Zn, Al) of the oxide semiconductor layer 13 except oxygen and the constituent element (Si) of the gate insulating film 12 except oxygen. The diameter of the beam used in the analysis is 1 nm or less so that analysis could be made with 1.5 nm pitch. The origin (O) of the horizontal axis in FIG. 6 is the interface between the gate insulating film 12 and the oxide semiconductor layer 13.

As shown in FIG. 6, it can be confirmed that a high In concentration region (high concentration region 13d) was formed in a region up to 6 nm from the interface with the gate insulating film 12. At this time, the difference between the peak In concentration of the high concentration region 13d and the In concentration of the other regions of the oxide semiconductor layer 13 was 30 at % or more.

Figure 7:
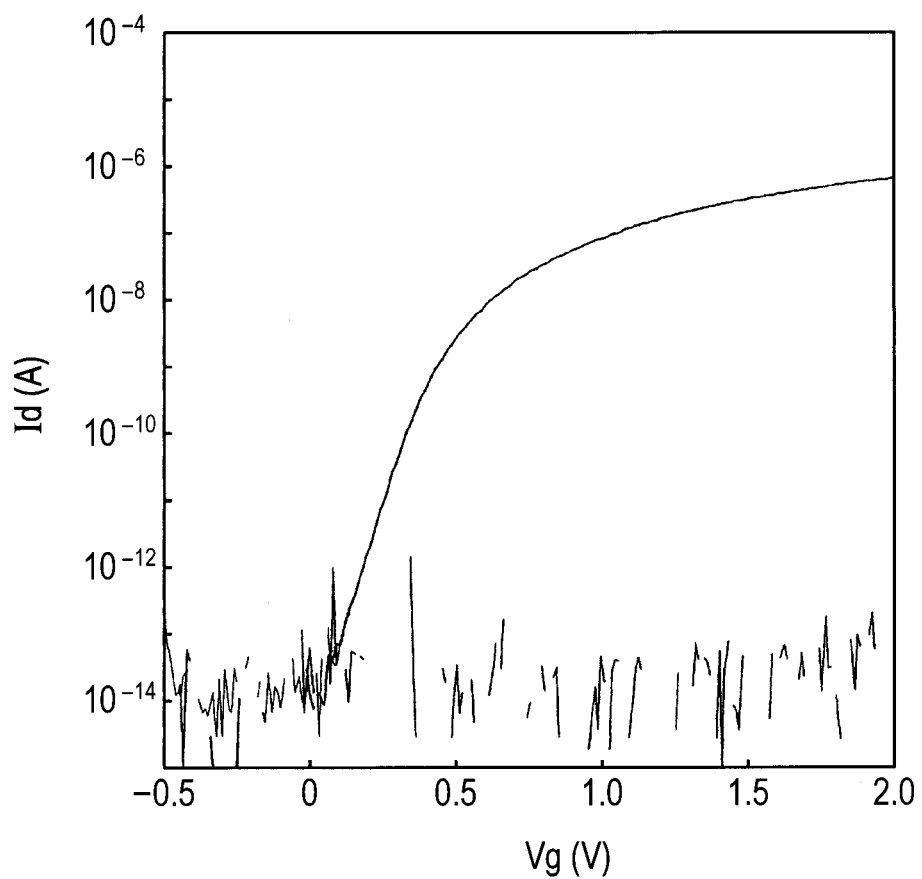
FIG. 7 is a graph which shows the relation between the gate voltage and drain current of the thin-film transistor according to the first embodiment of the present invention.

FIG. 7 is a graph which shows the relation between the gate voltage (Vg) and drain current (Id) of the thin-film transistor produced by the above method. As shown in FIG. 7, the sub-threshold slope of the thin-film transistor was 68 mV/decade. Also the field effect mobility was 50 $cm^2$/Vs or more and the on-current was $2 \times 10^{-4}$ A.

Comparative Example 1

A thin-film transistor was produced under the same conditions as in the first embodiment except that the difference between the peak In concentration of the high concentration region 13d and the In concentration of the other regions in the oxide semiconductor layer 13 was less than 30 at %.

Figure 8:
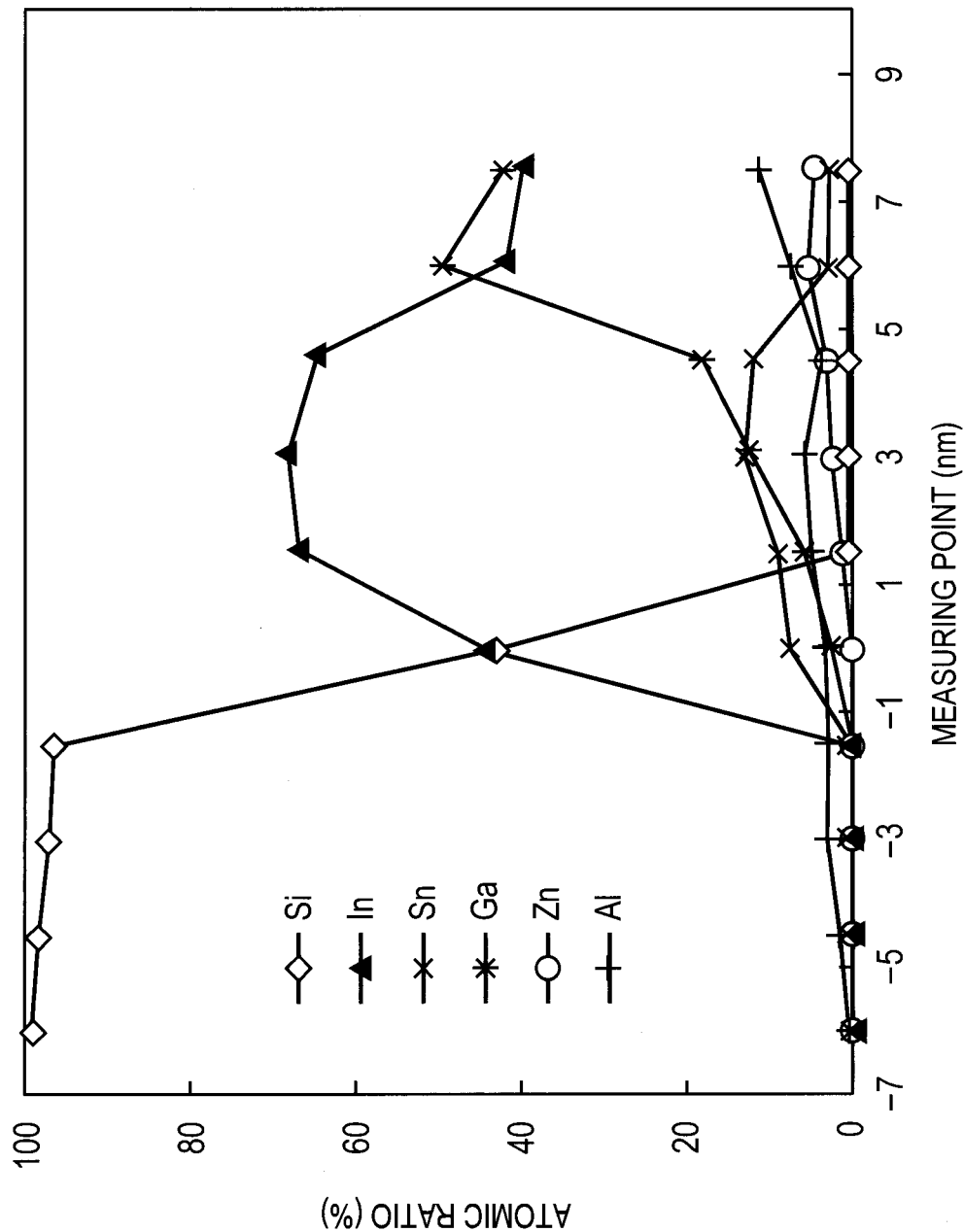
FIG. 8 is a graph which shows the result of analysis by the energy dispersive X-ray spectroscopy (EDX) method of composition distribution of constituent elements in the vicinity of the interface between the gate insulating film and oxide semiconductor layer of a thin-film transistor produced as a comparative example.

FIG. 8 shows the result of analysis by the energy dispersive X-ray spectroscopy (EDX) method of composition distribution of constituent elements in the vicinity of the interface between the gate insulating film 12 and oxide semiconductor layer 13 of the thin-film transistor as comparative example 1.

The elements which were analyzed are the constituent elements (In, Sn, Ga, Zn, Al) of the oxide semiconductor layer 13 except oxygen and the constituent element (Si) of the gate insulating film except oxygen. The diameter of the beam used in the analysis is 1 nm or less. The origin (O) of the horizontal axis in FIG. 8 is the interface between the gate insulating film 12 and the oxide semiconductor layer 13.

As shown in FIG. 8, it can be confirmed that a high In concentration region (high concentration region 13d) was formed in a region up to 6 nm from the interface with the gate insulating film 12. At this time, the difference between the maximum In concentration of the high concentration region 13d and the In concentration of the other regions was less than 30 at %. The sub-threshold slope of the thin-film transistor was 150 mV/decade. Also the field effect mobility was 50 cm$^2$/Vs or more and the on-current was $2\times10^{-4}$ A.

This result suggests that when the difference in In concentration between the high concentration region 13d and the other regions is smaller, the sub-threshold slope considerably increases though the field effect mobility and the on-current remain unchanged. The reason for this may be as follows: the In concentration of the other regions (regions except the high concentration region 13d) of the oxide semiconductor layer 13 becomes relatively high, so 5s electrons of In, which are attributable to conduction of carriers, can form a carrier network in the other regions as well and as a result, the entire oxide semiconductor layer 13 apparently functions as a single-layer channel layer with a large film thickness.

As described above, when the difference between the maximum In concentration of the high concentration region 13d and the In concentration of the other regions in the oxide semiconductor layer 13 was 30 at % or more, a thin-film transistor which provides a sub-threshold slope of 100 mV/decade max., a high field effect mobility of 50 cm$^2$/Vs or more and an on-current of $2\times10^{-4}$ A or more can be realized. Therefore, by forming a circuit using the thin-film transistor according to the first embodiment, a high-performance thin-film transistor circuit which can operate at low voltage and high speed can be realized.

Second Embodiment

Figure 9:
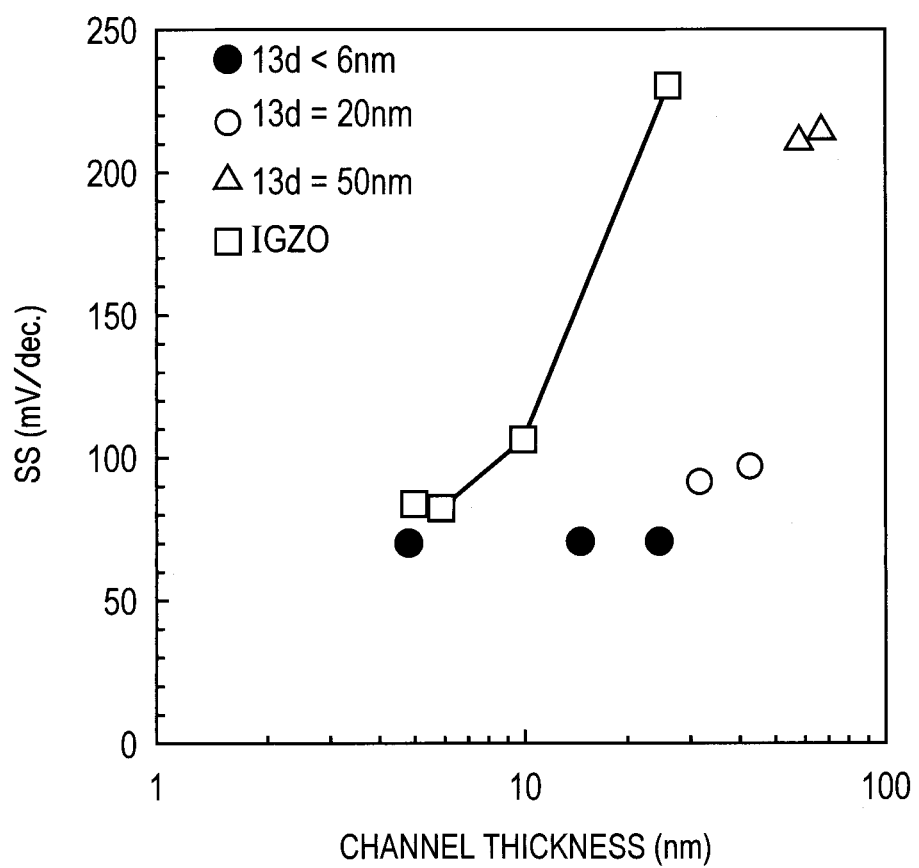
FIG. 9 is a graph which shows the relation between the film thickness and sub-threshold slope of the high concentration region of a thin-film transistor according to a second embodiment of the present invention.

Using the same materials and processes as in the first embodiment, three types of thin-film transistors which have different film thicknesses of the high concentration region (13d), namely (1) 6 nm or less, (2) 20 nm, and (3) 50 nm, were produced to study the relation between high concentration region film thickness and sub-threshold slope. Here, the difference between the maximum In concentration of the high concentration region and the In concentration of the other regions was 40 at % or more. FIG. 9 shows the result of the study. Also, for comparison, the relation between the film thickness of an oxide semiconductor layer of In—Ga—Zn—O (IGZO) and the sub-threshold slope is shown in FIG. 9.

As shown in FIG. 9, when the film thickness of the high concentration region is 6 nm or less, the sub-threshold slope is about 70 mV/decade, and when the film thickness is 20 nm, the sub-threshold slope is 100 mV/decade max. As the film thickness of the high concentration region increases, the sub-threshold slope increases and when the film thickness is 50 nm, it is about 200 mV/decade. In the case of a single-layer oxide semiconductor layer of In—Ga—Zn—O (IGZO), when its film thickness is 25 nm, the sub-threshold slope is 200 mV/decade or more.

This result suggests that in order to achieve a sub-threshold slope of 100 mV/decade, the film thickness of the high concentration region must be 20 nm or less. Also it can be known that when the film thickness of the high concentration region is 6 nm or less, a smaller sub-threshold slope can be achieved. However, if the film thickness of the high concentration region is too small, the above effect is small, so preferably the film thickness of the high concentration region should be 3 nm or more.

As described above, when the difference between the maximum In concentration of the high concentration region with a film thickness of 20 nm or less and the In concentration of the other regions is 40 at % or more, a thin-film transistor which provides a sub-threshold slope of 100 mV/decade max., a high field effect mobility of 50 cm$^2$/Vs or more and an on-current of $2\times10^{-4}$ A or more can be realized. Therefore, by forming a circuit using this thin-film transistor, a high-performance thin-film transistor circuit which can operate at low voltage and high speed can be realized.

Third Embodiment

For comparison in effect between the presence and absence of the high concentration region (13D), a thin-film transistor (sample A) having a high concentration region in the oxide semiconductor layer (13) and a thin-film transistor (sample B) having no high concentration region in the oxide semiconductor layer (13) were produced. The oxide semiconductor layer of sample A was made of In—Sn—Zn—O and the oxide semiconductor layer of sample B was made of In—Ga—Zn—O. The materials and processes used for the components other than the oxide semiconductor layer were the same as in the first embodiment.

Figure 10:
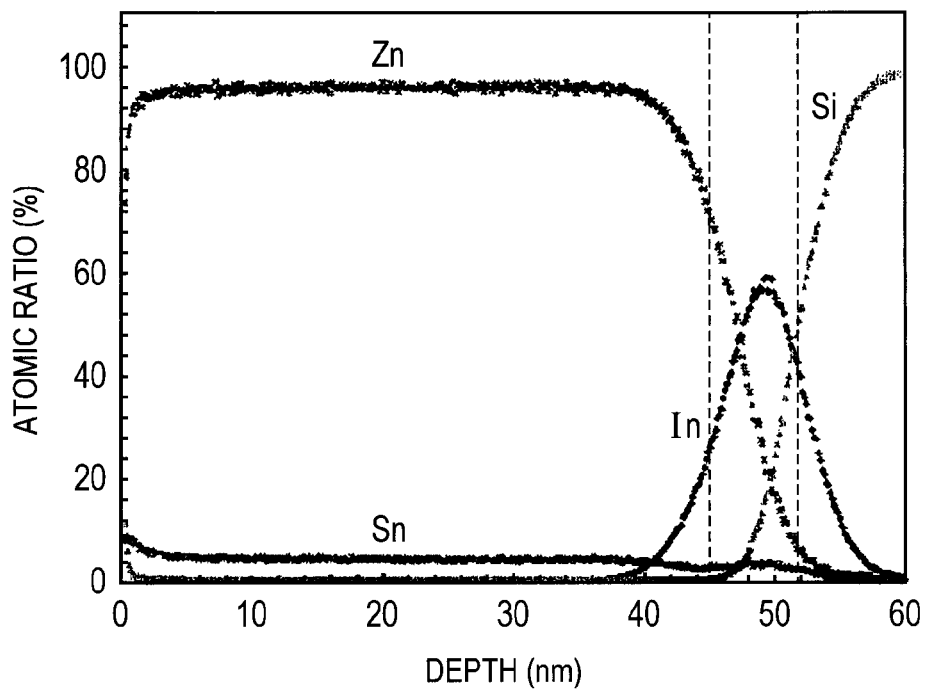
FIG. 10 is a graph which shows the result of analysis by a secondary ion mass spectrometer (SIMS) of composition distribution of constituent elements in the oxide semiconductor layer of a thin-film transistor (sample A) according to a third embodiment of the present invention.
Figure 12:
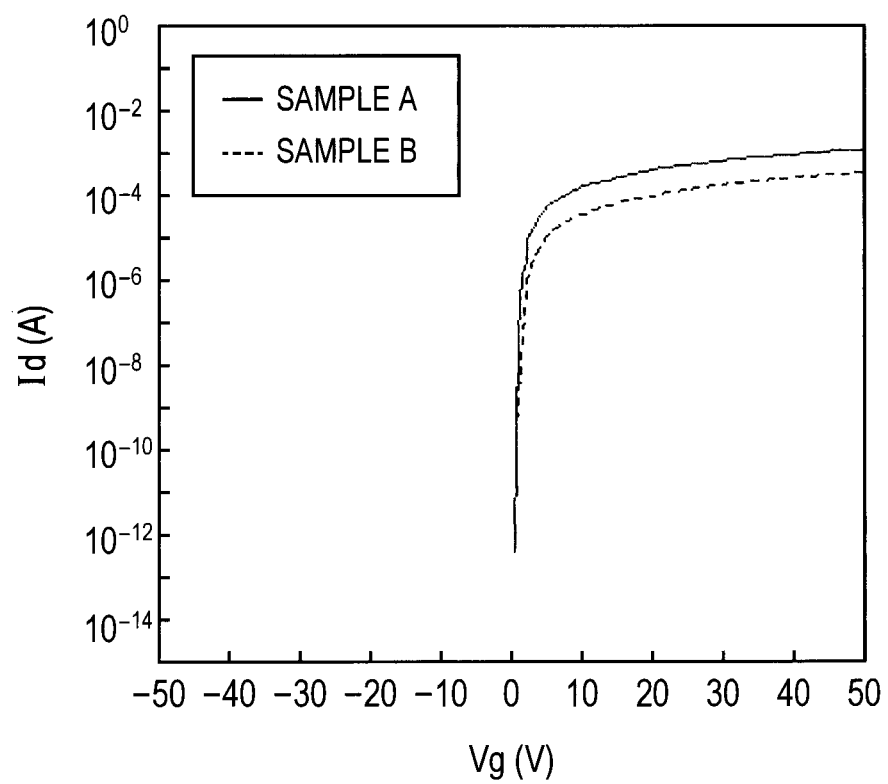
FIG. 12 is a graph which shows the relation between the gate voltage and drain current of the thin-film transistors (sample A and sample B) according to the third embodiment of the present invention.

FIG. 10 shows the result of analysis by a secondary ion mass spectrometer (SIMS) of composition distribution of constituent elements from the oxide semiconductor layer surface of sample A to the surface of the gate insulating film (12). From this figure, it is known that the oxide semiconductor layer of sample A has a high concentration region with a film thickness of about 6 nm and the difference between the maximum In concentration of the high concentration region and the In concentration of the other regions is 30 at % or more. The sub-threshold slope of sample A was 69 mV/decade and the field effect mobility was 50 cm$^2$/Vs or more and the on-current was $2\times10^{-4}$ A (FIG. 12).

Figure 11:
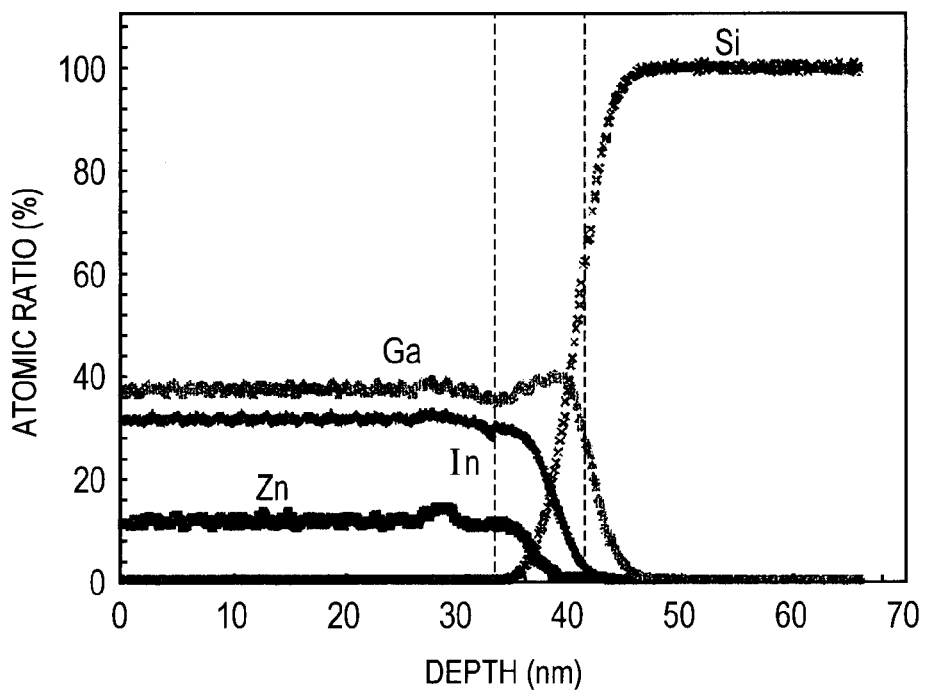
FIG. 11 is a graph which shows the result of analysis by a secondary ion mass spectrometer (SIMS) of composition distribution of constituent elements in the oxide semiconductor layer of a thin-film transistor (sample B) according to the third embodiment of the present invention.

FIG. 11 shows the result of analysis by a secondary ion mass spectrometer (SIMS) of composition distribution of constituent elements from the oxide semiconductor layer surface of sample B to the surface of the gate insulating film (12). From this figure it is known that no high concentration region, is seen in the oxide semiconductor layer of sample B and the In concentration is almost constant. Also, the sub-threshold slope of sample B was 250 mV/decade and the field effect mobility was 25 cm$^2$/Vs or more and the on-current was $0.9\times10^{-4}$ A (FIG. 12).

From the above result, it is known that by providing a high concentration region with a maximum In concentration 30 at % or more higher than the In concentration of the other regions of the oxide semiconductor layer, a thin-film transistor which provides a sub-threshold slope of 100 mV/decade max., a high field effect mobility of 50 cm$^2$/Vs or more and an on-current of $2\times10^{-4}$ A or more can be obtained.

Fourth Embodiment

The fourth embodiment is applied to a top gate/bottom contact thin-film transistor. Here, "top gate" means a structure in which a gate electrode is located in a layer above a channel layer and "bottom contact" means a structure in which a source electrode and a bottom electrode are located in a layer under a channel layer. Next, the method of manufacturing a top gate/bottom contact thin-film transistor will be described in the order of process steps.

Figure 13:
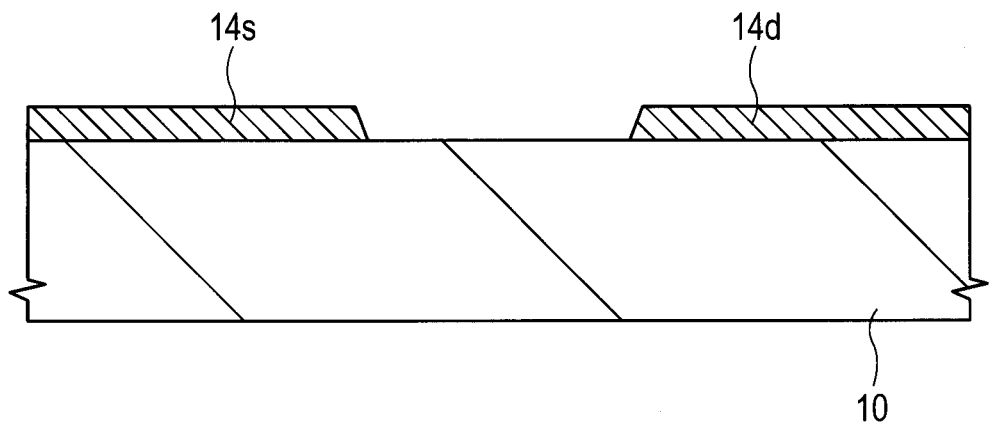
FIG. 13 is a sectional view showing a step of manufacturing a thin-film transistor according to a fourth embodiment of the present invention.

First, as shown in FIG. 13, by patterning a conductive film formed over an insulating substrate 10, a source electrode 14s and a drain electrode 14d are formed. The conductive film forming the source electrode 14s and drain electrode 14d and the method of pattering it may be the same as used in the first embodiment.

Figure 14:
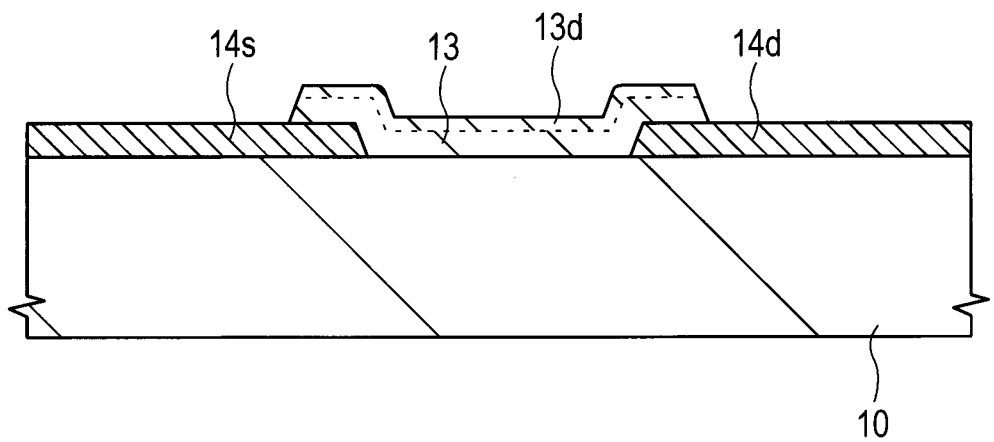
FIG. 14 is a sectional view showing a step of manufacturing a thin-film transistor which is subsequent to the step shown in FIG. 13.

Next, as shown in FIG. 14, after an oxide semiconductor layer 13 is formed over the substrate 10 with the source electrode 14s and drain electrode 14d formed thereon, the oxide semiconductor layer 13 is patterned so that the oxide semiconductor layer 13 remains intact in a region between the source electrode 14s and drain electrode 14d.

In the fourth embodiment, first an oxide semiconductor layer 13 of In—Si—Ge—Zn—O is formed over the substrate 10. The oxide semiconductor layer 13 is formed by a sputtering process, CVD process, PLD process, coating process, printing process, co-evaporation process or the like as mentioned earlier and its film thickness is 100 nm or less.

Next, the substrate 10 is heat-treated at about 300° C. to diffuse the elements in the oxide semiconductor layer 13 and generate concentration gradients of the elements in the oxide semiconductor layer 13. Consequently, a high concentration region 13d having a maximum In concentration 30 at % or more higher than the other regions of the oxide semiconductor layer 13 is produced in a portion of the oxide semiconductor layer 13 on the side of a gate electrode 11 which will be formed at a later step. The film thickness of the high concentration region 13d should be 20 nm or less, preferably 6 nm or less.

Then, the oxide semiconductor layer 13 is patterned by dry etching or wet etching using photoresist film as a mask.

Figure 15:
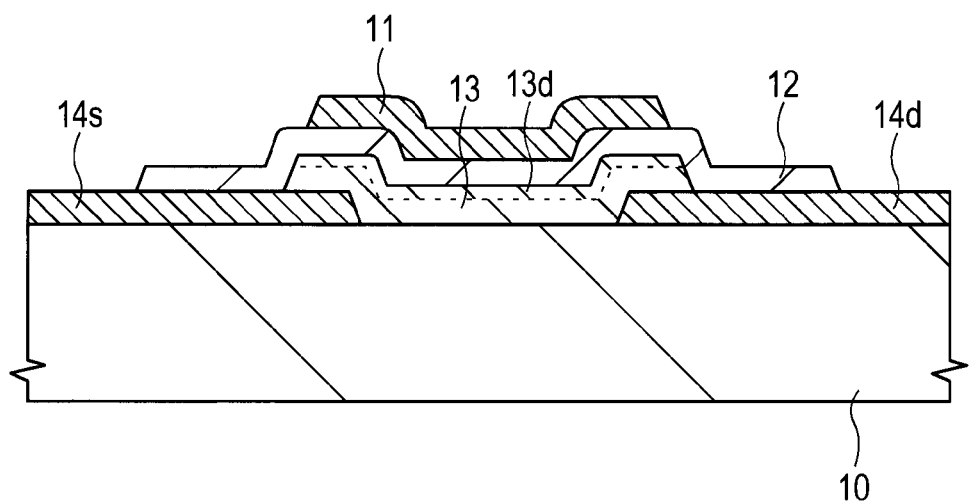
FIG. 15 is a sectional view showing a step of manufacturing a thin-film transistor which is subsequent to the step shown in FIG. 14.

Next, as shown in FIG. 15, a gate insulating film 12 is formed over the oxide semiconductor layer 13, and then a gate electrode 11 is formed over the gate insulating film 12. The insulating film of the gate insulating film 12 and the conductive film of the gate electrode 11 and the method of pattering, them may be the same as in the first embodiment. As a result of the above steps, the thin-film transistor according to the fourth embodiment is completed. The channel length of the thin-film transistor is 0.1 mm and the channel width is 2 mm.

A study of the characteristics of the thin-film transistor shows that the sub-threshold slope was 73 mV/decade. The field effect mobility was 50 cm$^2$/Vs or more and the on-current was $2\times10^{-4}$ A.

Fifth Embodiment

A thin-film transistor was produced using the same materials and processes as in the fourth embodiment except that among the constituent elements of the oxide semiconductor layer 13, In was replaced by Cd, Sn and Ce. A study of the characteristics of the thin-film transistor shows that the sub-threshold slope was about 100 mV/decade. The field effect mobility was about 30 to 50 cm$^2$/Vs and the on-current was $2\times10^{-4}$ A.

This result suggests that the conduction mechanism of the oxide semiconductor layer 13 largely depends on the s orbital of electrons and even with an element other than In, the same effect as with In can be achieved as far as an s orbital can be used for the element.

Sixth Embodiment

The sixth embodiment is applied to a bottom gate/bottom contact thin-film transistor. Here, "bottom gate" means a structure in which a gate electrode is located in a layer under a channel layer and "bottom contact" means a structure in which a source electrode and a drain electrode are located in a layer under a channel layer.

Figure 16:
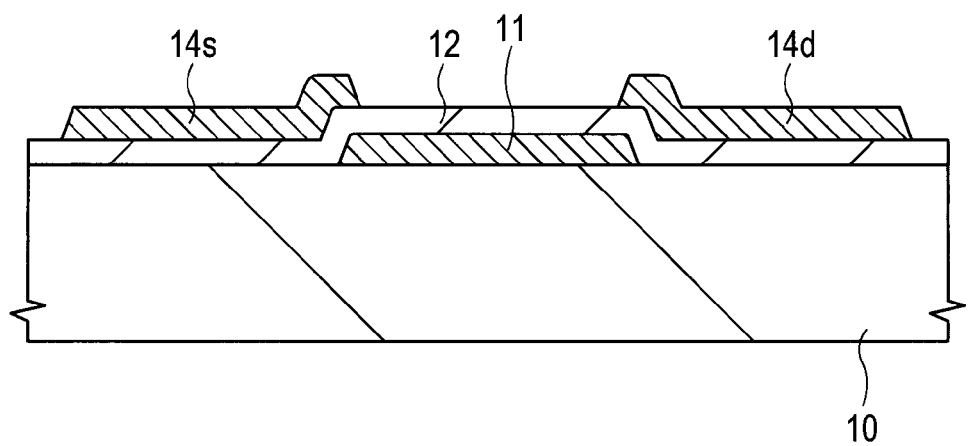
FIG. 16 is a sectional view showing a step of manufacturing a thin-film transistor according to a sixth embodiment of the present invention.

In order to manufacture a bottom gate/bottom contact thin-film transistor, as shown in FIG. 16, first a gate electrode 11, a gate insulating film 12, a source electrode 14s, and a drain electrode 14d are formed over a substrate 10 in the order of mention. The materials and processes used here are the same as in the first embodiment.

Figure 17:
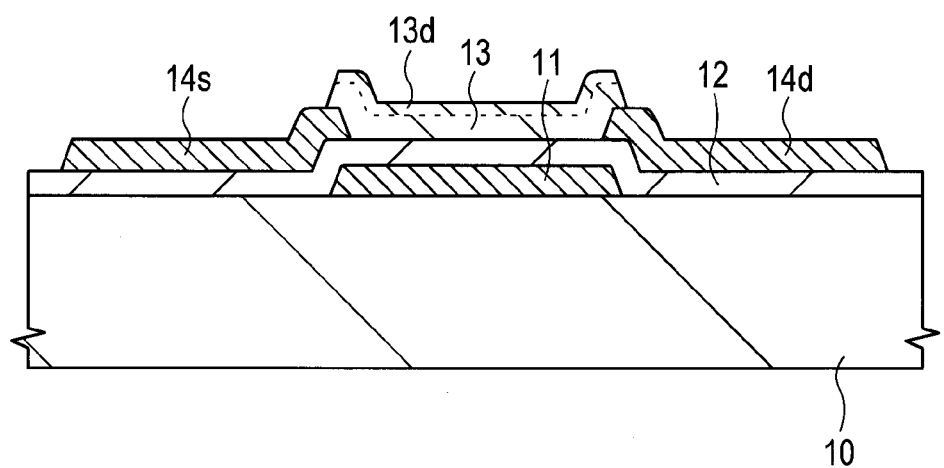
FIG. 17 is a sectional view showing a step of manufacturing a thin-film transistor which is subsequent to the step shown in FIG. 16.

Next, as shown in FIG. 17, an oxide semiconductor layer 13 is formed over the source electrode 14s and drain electrode 14d using the same processes as in the first embodiment. In the sixth embodiment, the oxide semiconductor layer 13 is made of In—Ce—Zn—Sn—O and its film thickness is 50 nm. While in any of the thin-film transistors according to the first to fifth embodiments a high concentration region 13d is formed in the oxide semiconductor layer 13 near the gate electrode 11, in the sixth embodiment a high concentration region 13d is formed in the oxide semiconductor layer 13 on the side remoter from the gate electrode 11. The film thickness of the high concentration region 13d is 10 nm.

As a result of the above steps, the thin-film transistor according to the sixth embodiment is completed. The channel length of the thin-film transistor is 0.1 mm and the channel width is 2 mm.

Figure 18:
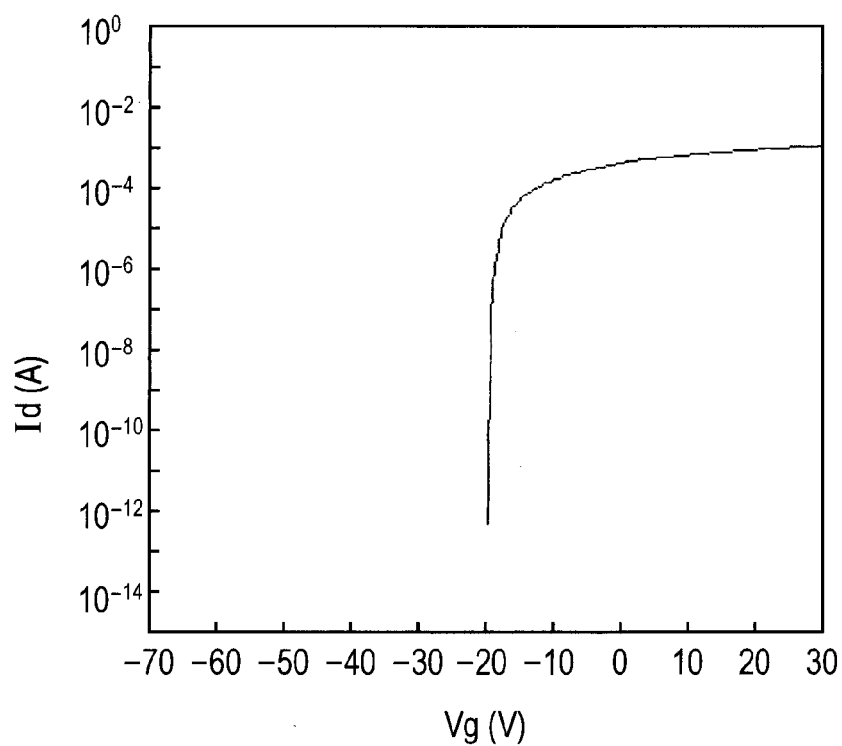
FIG. 18 is a graph which shows the relation between the gate voltage and drain current of the thin-film transistor according to the sixth embodiment of the present invention.

FIG. 18 is a graph which shows the relation between gate voltage Vg and drain current (Id) of the thin-film transistor produced by the above method. As shown in FIG. 18, like the thin-film transistor according to the first embodiment, the sub-threshold slope of the thin-film transistor was 100 mV/decade max., its field effect mobility was 50 cm$^2$/Vs or more and its on-current was about $2\times10^{-4}$ A.

In addition, the threshold potential shifted to −20 V and it has been found that the amount of shift depends on the film thickness of the oxide semiconductor layer 13 and the film thickness of the high concentration region 13d. This indicates that the threshold potential value can be controlled by controlling the film thickness of the oxide semiconductor layer 13 and the film thickness of the high concentration region 13d. Therefore, a functional circuit which operates stably can be realized by combining two types of thin-film transistors with different threshold potentials, for example, the thin-film transistor according to the first embodiment and the thin-film transistor according to the sixth embodiment.

Seventh Embodiment

The seventh embodiment is applied to a top gate/top contact thin-film transistor. Here, "top gate" means a structure in which a gate electrode is located in a layer above a channel layer and "top contact" means a structure in which a source electrode and a drain electrode are located in a layer above a channel layer.

Figure 19:
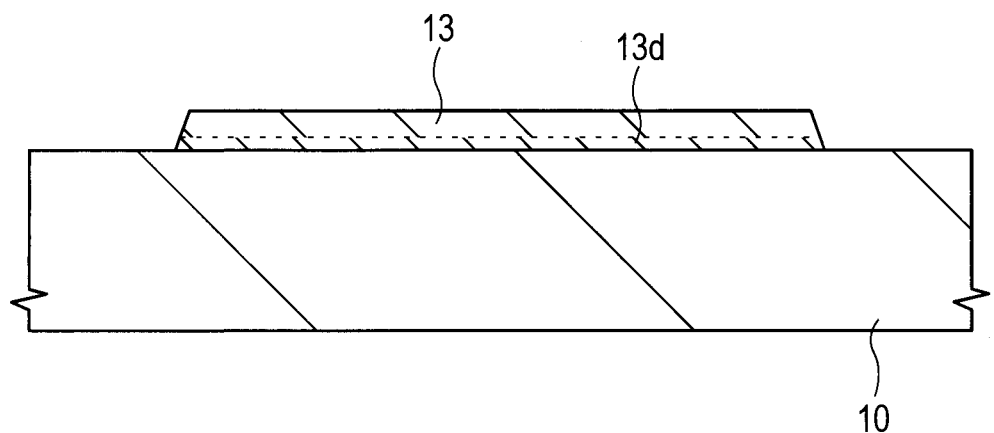
FIG. 19 is a sectional view showing a step of manufacturing a thin-film transistor according to a seventh embodiment of the present invention.

In order to manufacture a top gate/top contact thin-film transistor, as shown in FIG. 19, first an oxide semiconductor layer 13 is formed over a substrate 10. In the seventh embodiment, the oxide semiconductor layer 13 is made of In—Zn—Sn—O and its film thickness is 50 nm. A high concentration region 13d is formed on the side remoter from a gate electrode 11 (near the substrate 10) which will be formed at a later step and its film thickness is 5 nm.

Figure 20:
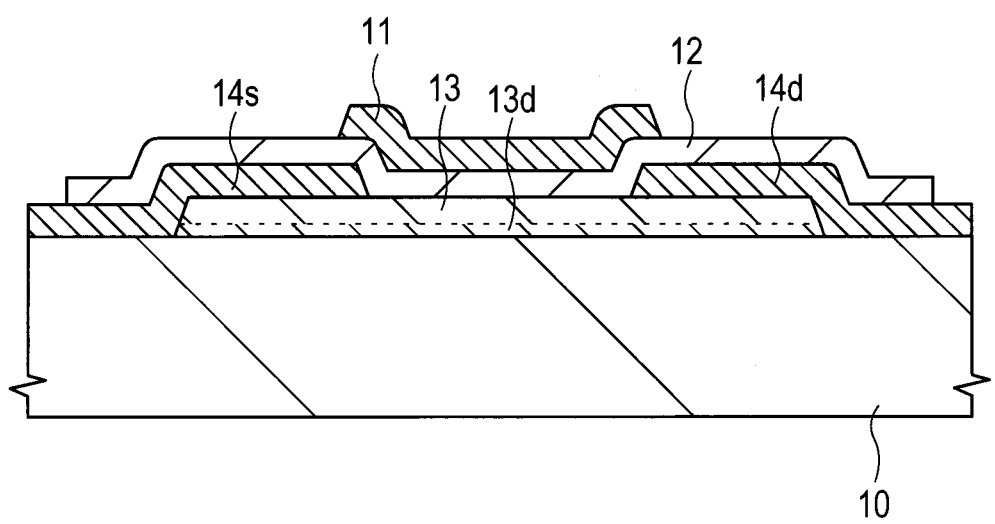
FIG. 20 is a sectional view showing a step of manufacturing a thin-film transistor which is subsequent to the step shown in FIG. 19.

Next, as shown in FIG. 20, a source electrode 14s, a drain electrode 14d, a gate insulating film 12, and a gate electrode 11 are formed over the oxide semiconductor layer 13 in the order of mention. The materials and processes used here are the same as in the first embodiment.

As a result of the above steps, the thin-film transistor according to the seventh embodiment is completed. The channel length of the thin-film transistor is 0.1 mm and the channel width is 2 mm.

The sub-threshold slope, field effect mobility, and on-current of the thin-film transistor produced by the above method were equal to those of the thin-film transistor according to the sixth embodiment. The threshold potential shifted to −10 V.

Eighth Embodiment

Figure 21:
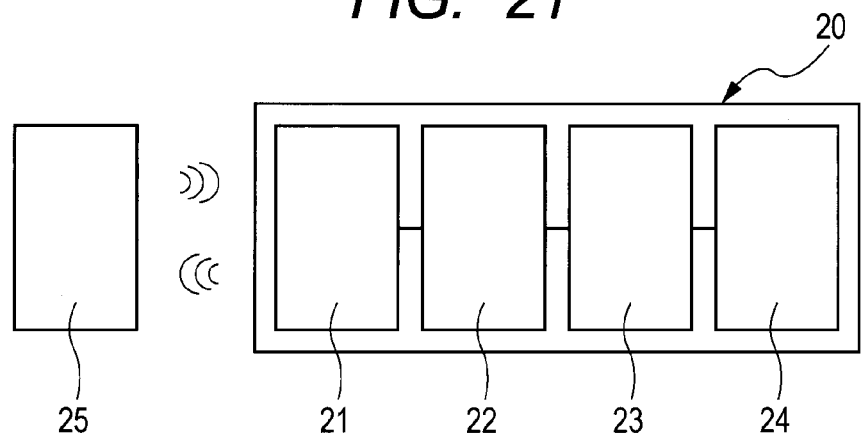
FIG. 21 shows the general configuration of an RFID tag using a thin-film transistor according to the present invention.

FIG. 21 shows the general configuration of an RFID tag 20 which uses a thin-film transistor according to any of the first to seventh embodiments to make an antenna resonance circuit 21, rectifier 22, modulator 23, and digital circuit 24.

The RFID tag 20 can wirelessly communicate with an external reader/writer 25 using, for example, a radio frequency of 13.56 MHz. Since the oxide semiconductor layer (13) of the channel layer of the thin-film transistor is a transparent material, an almost transparent circuit can be formed in the IC chip.

For example, a transparent wireless IC tag which sends and receives signals at a radio frequency (RF) of 13.56 MHz can be produced by using transparent conductive film such as ITO for the electrodes and wiring of the IC chip and making a circuit element using a thin-film transistor according to the present invention. Unlike conventional RFID tags, this type of wireless IC tag has an IC chip and an antenna which are almost transparent, so when it is attached to a film or card, it does not impair the design printed on the film or card.

Ninth Embodiment

Figure 22:
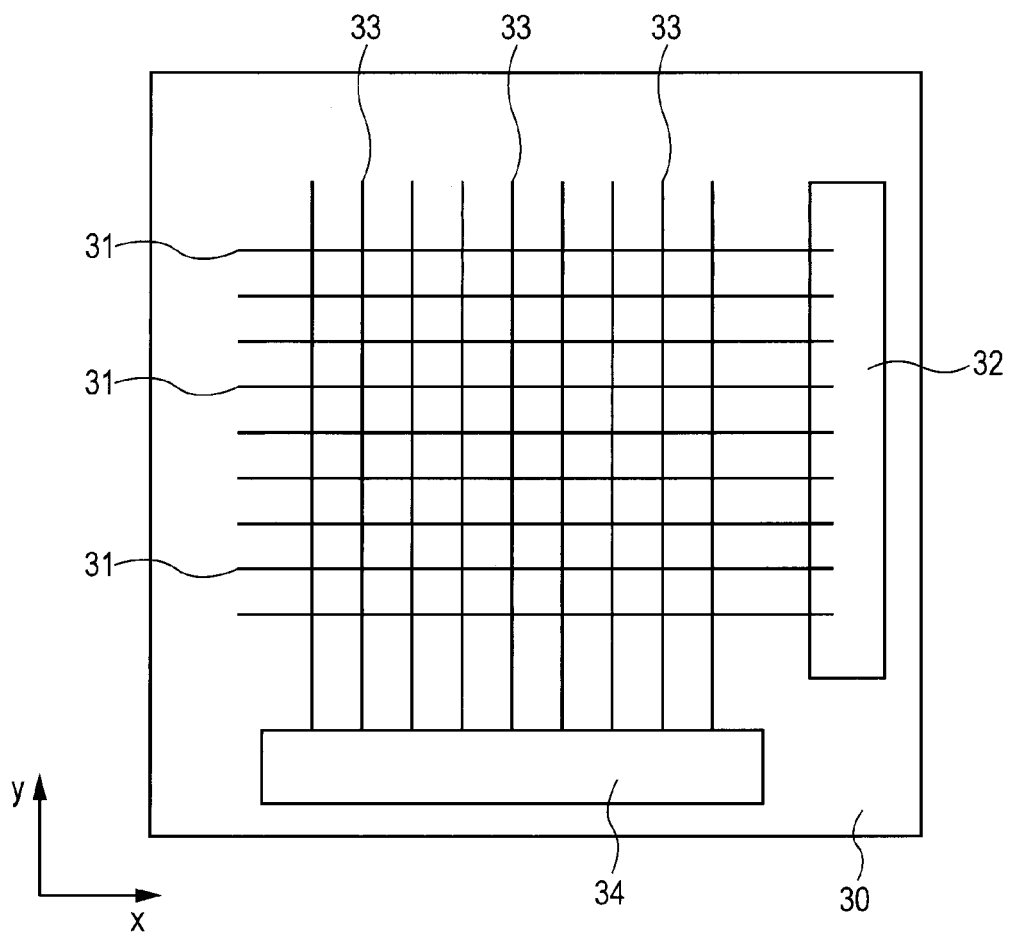
FIG. 22 is a circuit block diagram which shows the configuration of a semiconductor device according to a ninth embodiment of the present invention.

FIG. 22 is a circuit block diagram which shows the configuration of a semiconductor device according to the ninth embodiment. In the semiconductor device according to the ninth embodiment, elements including the thin-film transistors according to any of the first to seventh embodiments are arranged in an array pattern over a substrate 30. The thin-film transistor may be used not only as a switching transistor or driver transistor of each element in the array but also as a transistor of a gate line drive circuit 32 for sending signals to a gate wire 31 coupled to the gate electrode (11) of the thin-film transistor or of a data line drive circuit 34 for sending signals to a data wire 33 coupled to the source electrode (14s) and drain electrode (14d) of the thin-film transistor. In this case, the thin-film transistor of each element and the thin-film transistor in the gate line drive circuit 32 and data line drive circuit 34 can be formed concurrently.

Figure 23:
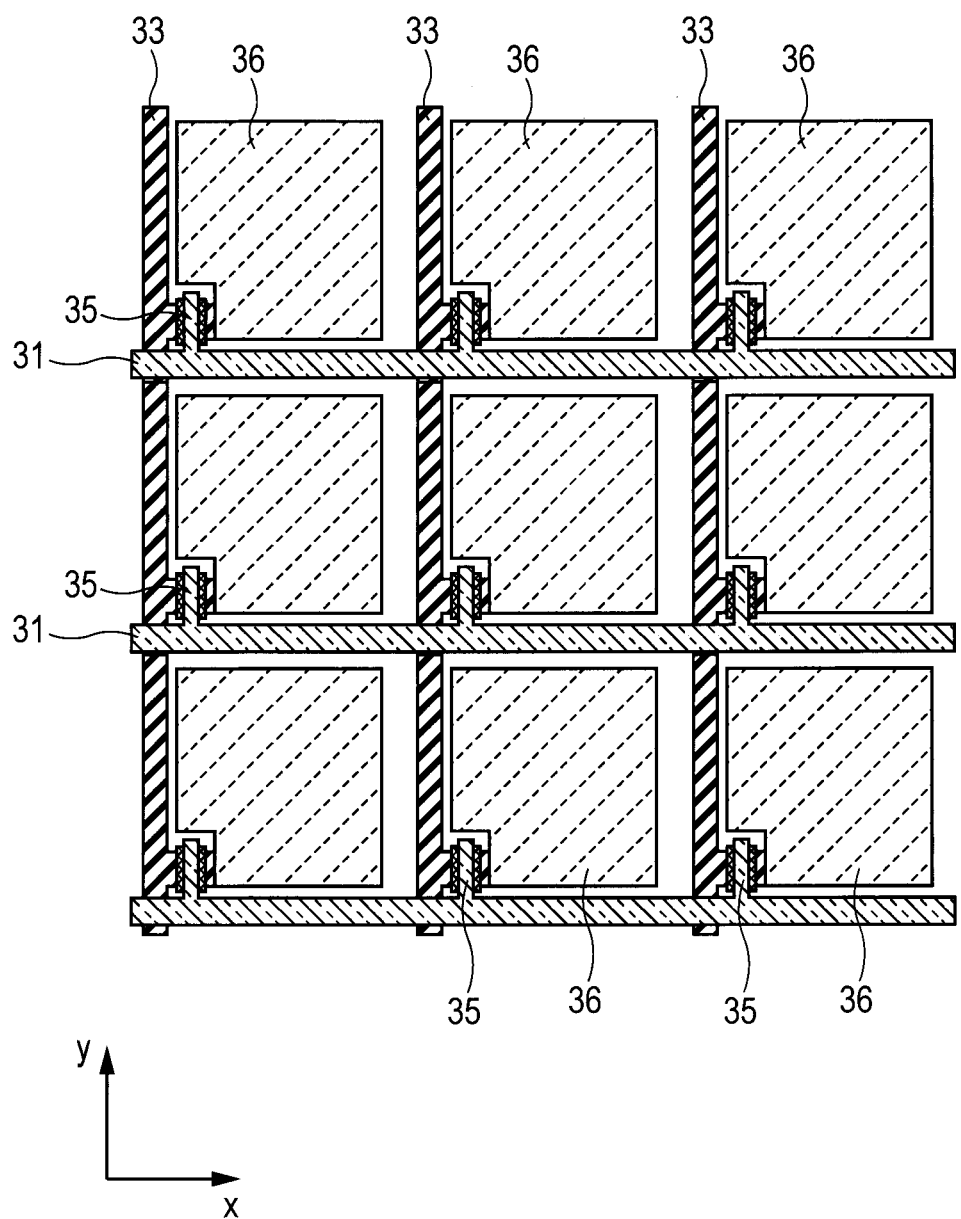
FIG. 23 is a schematic view of an active matrix liquid crystal display device to which the array shown in FIG. 22 is applied.

When the above array is applied to an active matrix liquid crystal display device, the elements are structured, for example, as shown in FIG. 23. As a scan signal is sent to a gate wire 31 extending in the x direction shown in the figure, a thin-film transistor 35 is turned on and a video signal from a data wire 33 extending in the y direction shown in the figure is sent to a pixel electrode 36 through the thin-film transistor 35 which has turned on.

The gate wires 31 are arranged in the y direction in the figure parallel to each other and the data wires 33 are arranged in the x direction in the figure parallel to each other and a pixel electrode 36 is located in a region (pixel region) surrounded by a pair of neighboring gate wires 31 and a pair of neighboring data wires 33. In this case, for example, the data wires 33 are electrically coupled with a source electrode (14s) and the pixel electrode 36 is electrically coupled with a drain electrode (14d). Alternatively a data wire 33 may also function as a source electrode (14s). Furthermore, the above array may be applied not only to a liquid crystal display device but also to an organic EL display device. In this case, a thin-film transistor is used for a transistor constituting a pixel circuit. Furthermore, the above array may be applied to a storage device and a thin-film transistor may be used for a selective transistor.

The invention made by the present inventors has been so far explained concretely in reference to the embodiments thereof. However, the invention is not limited to the above embodiments and it is obvious that these details may be modified in various ways without departing from the gist of the invention.

INDUSTRIAL APPLICABILITY

The present invention can be applied to a semiconductor device having a thin-film transistor (TFT) using oxide semiconductor for a channel layer.

The invention claimed is:

1. A semiconductor device having a thin-film transistor comprising a gate insulating film, a gate electrode, a channel layer, a source electrode, and a drain electrode which are formed over a main surface of a substrate, wherein
   the channel layer of the thin-film transistor is made of oxide semiconductor containing at least In and oxygen and further containing one or more types of elements among Zn, Cd, Al, Ga, Si, Sn, Ce, and Ge;
   a portion of the channel layer has a high concentration region with a maximum In concentration 30 at % or higher than other regions of the channel layer; and
   film thickness of the high concentration region is 20 nm or less.

2. The semiconductor device according to claim 1, wherein film thickness of the channel layer is 100 nm or less.

3. The semiconductor device according to claim 2, wherein the film thickness of the high concentration region is 6 nm or less.

4. A semiconductor device having a first thin-film transistor and a second thin-film transistor each comprising a gate insulating film, a gate electrode, a channel layer, a source electrode, and a drain electrode which are formed over a main surface of a substrate, wherein
   the channel layer of each of the first and second thin-film transistors is made of oxide semiconductor containing at least In and oxygen and further containing one or more types of elements among Zn, Cd, Al, Ga, Si, Sn, Ce, and Ge;
   the channel layer of the first thin-film transistor has, in a region nearest to the gate electrode, a high concentration region with a maximum In concentration 30 at % or more higher than other regions of the channel layer;
   the channel layer of the second thin-film transistor has, in a region remotest from the gate electrode, a high concentration region with a maximum In concentration 30 at % or higher than the other regions of the channel layer; and
   film thickness of the high concentration region of each of the first and second thin-film transistors is 20 nm or less.

5. The semiconductor device according to claim 4, wherein film thickness of the channel layer of each of the first and second thin-film transistors is 100 nm or less.

6. The semiconductor device according to claim 5, wherein the film thickness of the high concentration region of each of the first and second thin-film transistors is 6 nm or less.

7. The semiconductor device according to claim 1, wherein distribution of elements in the channel layer is analyzed by a secondary ion mass spectrometer (SIMS).

8. The semiconductor device according to claim 1, wherein distribution of elements in the channel layer is analyzed by an energy dispersive X-ray spectroscopy (EDX) method.

9. The semiconductor device according to claim 1, wherein the high concentration region is formed by a multi-target sputtering method or co-evaporation method.

10. The semiconductor device according to claim 1, wherein the high concentration region is formed by a thermal diffusion method.

11. An RFID tag having an antenna section and an IC chip, the IC chip having a thin-film transistor comprising a gate insulating film, a gate electrode, a channel layer, a source electrode, and a drain electrode which are formed over a main surface of a substrate, wherein the channel layer of the thin-film transistor is made of oxide semiconductor containing at least In and oxygen and further containing one or more types of elements among Zn, Cd, Al, Ga, Si, Sn, Ce, and Ge;

a portion of the channel layer has a high concentration region with a maximum In concentration 30 at % or higher than other regions of the channel layer; and film thickness of the high concentration region is 20 nm or less.

12. A display device having a thin-film transistor comprising a gate insulating film, a gate electrode, a channel layer, a source electrode, and a drain electrode which are formed over a main surface of a substrate, wherein the channel layer of the thin-film transistor is made of oxide semiconductor containing at least In and oxygen and further containing one or more types of elements among Zn, Cd, Al, Ga, Si, Sn, Ce, and Ge;

a portion of the channel layer has a high concentration region with a maximum In concentration 30 at % or higher than other regions of the channel layer; and film thickness of the high concentration region is 20 nm or less.

* * * * *